June 27, 1967 E. G. STROMER 3,328,607
TRIGGER CIRCUIT HAVING ADJUSTABLE SIGNAL SENSITIVITY
Filed Jan. 18, 1965
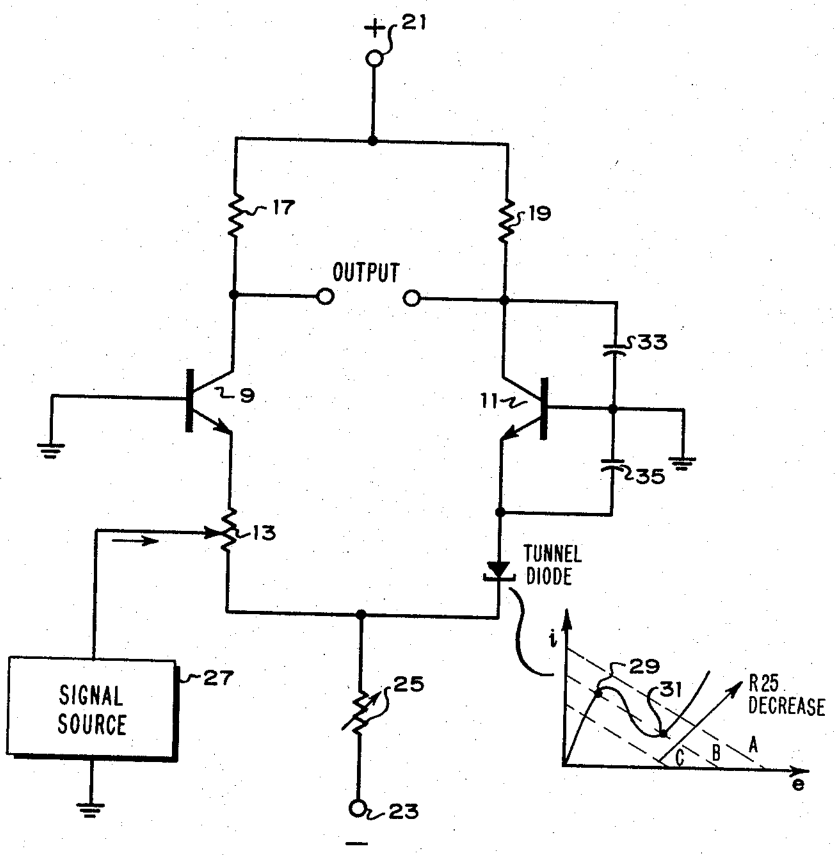
INVENTOR
EDGAR G. STROMER
BY Q. C. Smith
ATTORNEY

United States Patent Office 3,328,607

Patented June 27, 1967

3,328,607

TRIGGER CIRCUIT HAVING ADJUSTABLE SIGNAL SENSITIVITY

Edgar G. Stromer, Mannedorf, Zurich, Switzerland, assignor to Hewlett-Packard Company, Palo Alto, Calif., a corporation of California Filed Jan. 18, 1965, Ser. No. 426,164
3 Claims. (Cl. 307—88.5)

ABSTRACT OF THE DISCLOSURE

An improved trigger circuit includes a pair of common base transistor amplifier stages with a tunnel diode and impedance element serially connected between the input emitters of the amplifier stages. Input signal is applied to an adjustable tap on the impedance element to alter the sensitivity of the trigger circuit to input signal.

This invention relates to a tunnel diode trigger circuit having temperature compensation and variable trigger level.

It is an object of the present invention to provide an improved trigger circuit which has a variable trigger level and which is temperature stabilized for dependable operation over a wide range of temperatures.

It is another object of the present invention to provide a trigger circuit which eliminates feed-through to the output of input signal components.

It is still another object of the present invention to provide an improved high frequency trigger circuit which may be readily adjusted to respond to selected ones of positive and negative trigger pulses.

In accordance with the illustrated embodiment of the present invention, a tunnel diode and load resistor are serially connected between the inputs of a pair of low impedance input amplifiers. Trigger pulses are applied to the series circuit at a point intermediate the input terminals of the amplifiers. With the load and tunnel diode properly selected, division of the input trigger pulses across the two elements connected to the amplifier inputs is substantially equal and the components of the input pulses are canceled in the output of the amplifiers. Symmetrical connection of temperature-sensitive elements in the circuit provide temperature compensation.

These and other objects of the present invention will be apparent from a reading of this specification and an inspection of the accompanying drawing which shows a circuit diagram of the present trigger circuit.

Referring to the drawing, there is shown a pair of common base transistor amplifier stages 9 and 11 having inputs at the emitter electrodes. A load resistor 13 and tunnel diode 15 are serially connected between the emitter electrodes of amplifiers 9 and 11 and a pair of resistors 17 and 19 are serially connected between the collector electrodes. One terminal 21 of a bias supply is connected to the common connection of resistors 17 and 19 and the other terminal 23 of the bias supply is connected through a large resistor to the common connection of resistor 13 and the tunnel diode 15 for supplying a substantially constant bias current. This bias current flows in each of the amplifiers and thus produces no net differential output across the resistors 17 and 19. With resistor 25 set to bias the tunnel diode 15 along the load line shown at B in the graph, the circuit operates in the bistable mode. Assuming that amplifier 11 is more highly conductive than amplifier 9, the tunnel diode 15 operates in the high current stable state 29. A signal of negative polarity applied to the serially connected resistor 13 and the tunnel diode 15 from source 27 momentarily increases the current through tunnel diode 15 above the current level at operating point 29 and biases amplifier for operation in the highly conductive region. The constant current through resistor 25 then switches from flowing through tunnel diode 15 (now biased at operating point 31) to flowing through resistor 13 and amplifier 9. The change in conductivities of amplifiers 9 and 11 produces a differential output pulse across the resistors 17 and 19 independent of the wave form of the input signal from source 27. A subsequent positive-going signal from source 27 momentarily decreases current through diode 15 causing it to switch to operation at point 29 and biases amplifier 9 for operation in the low conductivity region. The current through resistor 25 which previously flowed in amplifier 9 switches to flowing in tunnel diode 15 and amplifier 11, thus producing a differential output pulse across resistors 17 and 19.

The point on resistor 13 at which the input signal is applied to the present circuit is selected to balance the current division between the impedances connected to the inputs of amplifiers 9 and 11. When the circuit is properly balanced, the input signal waveform is applied equally to amplifier stages 9 and 11 and hence cancel out in the differential output across resistors 17 and 19.

In applications in which cancellation of the input signal components is not critical, the trigger level may be altered by varying the resistance on both sides of the input contact on resistor 13, thereby to increase or decrease the portion of input signal fed to the tunnel diode 15. This tends to unbalance the division of signal applied to the inputs of amplifiers 9 and 11 and thus causes components of the input signal to apear in the output across resistors 17 and 19. Also, an inexpensive, low frequency transistor 11 may be used with its base-collector and base-emitter junctions by-passed by capacitors 33 and 35 without materially affecting circuit performance. The input impedance of this amplifier stage is maintained low by capacitor 35 despite the inability of such a transistor to respond to high frequencies or sharp pulses. An output may thus be taken across resistor 17 with respect to ground as a function of the current through amplifier 9.

Adjustment of resistor 25 to bias the tunnel diode 15 along load lines A or C in the graph renders the circuit operable in the monostable mode and is triggerable only with input signals of one or the other polarity, respectively. The low impedance inputs of the common base amplifiers 9 and 11 show equivalent inductive reactances in the series circuit connected between these amplifier inputs and thus provide an inductive-resistive timing circuit that determines the relaxation time of the circuit. Additional inductance may be added in the series circuit of resistor 13 and tunnel diode 15, for example, between the emitter electrode of amplifier 9 and resistor 13.

Temperature compensation in each of the operating modes is provided by the symmetrical arrangement of the temperature-sensitive base-emitter junctions which connect the serially-connected resistor 13 and tunnel diode 15 to ground. The voltage drops across these temperature-sensitive junctions increase substantially equally with temperature for transistors of similar material (i.e. germanium or silicon) and thus maintain the operating conditions of the tunnel diode 15 and resistor 13 unchanged with temperature.

I claim:

1. A signalling circuit comprising:

a pair of transistors, each having emitter, base and collector electrodes;

a source of reference potential connected to each of said base electrodes;

an impedance element having a pair of end terminals and a tap terminal connected to the impedance element intermediate the end terminals thereof;

a series circuit including a tunnel diode and the end terminals of said impedance element connected between the emitter electrodes of said transistors;

a source of current connected to the common connection of said tunnel diode and impedance element to bias said tunnel diode for operation in at least one stable operating state;

an input for said signalling circuit connected to the tap terminal of said impedance element for receiving applied signals; and means connected to the collector electrodes of said transistors for producing an output signal as the combination of signals appearing on said collector electrodes.

2. A signalling circuit as in claim 1 wherein:

said source of current biases the tunnel diode for operation in two stable states.

3. A signalling circuit as in claim 1 wherein:

said impedance element is a resistive element and said tap terminal is connected to the resistive element at selectable locations thereon intermediate the end terminals for altering the sensitivity of the signalling circuit to signals applied to said input in response to the location of the connection of the tap terminal to said resistive element.

References Cited

UNITED STATES PATENTS

| | | | |
|---|---|---|---|
| 3,194,974 | 7/1965 | Rymaszewski | 307—88.5 |
| 3,207,913 | 9/1965 | Herzog | 307—88.5 |
| 3,211,921 | 10/1965 | Kaufman et al. | 307—88.5 |
| 3,230,387 | 1/1966 | Groudis et al. | 307—88.5 |
| 3,254,238 | 5/1966 | Cooperman | 307—88.5 |

ARTHUR GAUSS, *Primary Examiner.*

J. JORDAN, *Assistant Examiner.*